(12) United States Patent
Sharma (10) Patent No.: US 7,027,320 B2
(45) Date of Patent: Apr. 11, 2006

(54) SOFT-REFERENCE MAGNETIC MEMORY DIGITIZED DEVICE AND METHOD OF OPERATION

(75) Inventor: Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 71 days.

(21) Appl. No.: 10/690,372

(22) Filed: Oct. 21, 2003

(65) Prior Publication Data

US 2005/0083728 A1   Apr. 21, 2005

(51) Int. Cl.
*G11C 11/00* (2006.01)

(52) U.S. Cl. .................. 365/158; 365/171; 365/173

(58) Field of Classification Search ............... 365/158, 365/171, 173, 225.5, 98; 345/440.1, 173, 345/179; 324/244
See application file for complete search history.

(56) References Cited

U.S. PATENT DOCUMENTS

| | | | |
|---|---|---|---|
| 4,816,813 A * | 3/1989 | Furno et al. ............. 345/440.1 |
| 5,448,421 A * | 9/1995 | Matsuda et al. ......... 365/225.5 |
| 5,554,828 A | 9/1996 | Primm |
| 5,576,502 A | 11/1996 | Fukushima et al. |
| 5,627,348 A | 5/1997 | Berkson et al. |
| 5,640,343 A | 6/1997 | Gallagher et al. |
| 5,734,130 A | 3/1998 | Baker |
| 5,793,697 A | 8/1998 | Scheuerlein |
| 6,104,632 A * | 8/2000 | Nishimura .................. 365/158 |
| 6,121,771 A * | 9/2000 | Moser ........................ 324/244 |
| 6,256,224 B1 | 7/2001 | Perner et al. |
| 6,391,483 B1 * | 5/2002 | Zhu et al. ...................... 365/98 |
| 6,538,917 B1 * | 3/2003 | Tran et al. .................. 365/158 |
| 6,538,920 B1 * | 3/2003 | Sharma et al. ............. 365/171 |
| 6,603,677 B1 * | 8/2003 | Redon et al. ............... 365/158 |
| 6,760,016 B1 * | 7/2004 | Sharma ....................... 345/173 |
| 6,781,578 B1 * | 8/2004 | Sharma ....................... 345/173 |
| 6,798,404 B1 * | 9/2004 | Sharma ....................... 345/173 |
| 6,819,587 B1 * | 11/2004 | Sharma ....................... 365/171 |
| 6,924,793 B1 * | 8/2005 | Sharma ....................... 345/179 |
| 2003/0117840 A1 | 6/2003 | Sharma et al. |
| 2003/0122788 A1 | 7/2003 | Sharma |
| 2003/0122789 A1 | 7/2003 | Sharma |
| 2003/0122790 A1 | 7/2003 | Sharma |

* cited by examiner

*Primary Examiner*—Trong Phan (57) ABSTRACT

A retractable camera apparatus is disclosed. Through the use of the apparatus, a video teleconference environment can communicate, in real time, such personal features as gesture, expression and body language. The apparatus includes a housing portion, at least one arm portion coupled to the housing portion wherein the at least one arm portion is capable of being moved between a retracted position and a deployed position and a plurality of cameras coupled to the at least one arm portion.

34 Claims, 7 Drawing Sheets

SOFT-REFERENCE MAGNETIC MEMORY DIGITIZED DEVICE AND METHOD OF OPERATION

FIELD OF THE INVENTION

This invention relates generally to digitizer input devices, and in particular to the use of soft-reference magnetic random access memory (commonly referred to as "MRAM") as a digitizing array.

BACKGROUND OF THE INVENTION

Providing an alternative means of user input, digitizer systems are commonly found in an ever increasing variety of computer applications. Typically, a sensing array is responsive to a stylus used by a user to enter data directly upon the array. The placement and/or movement of the stylus in pointing, writing and or sketching upon the array is used to control various computer functions.

In some embodiments the digitizer is provided directly over the visual display monitor (a touch screen), whereas in other embodiments the digitizer is provided as a separate and apart from the display (a touch pad). Use and application of either may be employed in various types of computer systems including laptops, home systems, kiosk, or other system displays.

Several types of stylus input digitizing devices are known in the prior art. One type involves direct contact of a stylus tip against a capacitive-resistive array. When the tip of the stylus is placed proximate to an area of the digitizing surface, a capacitive-resistive circuit within the pad detects the placement of the stylus and computes its location according to well-known mathematical formulas associated with grid-based arrays.

Other types of prior art system use an RF transmitter to send signals from the digitizer to the stylus or vis-a-versa, or may use a light source (visible or infrared) within the tip of the stylus which is directed by the user upon desired portions of the digitizer pad. In such cases the location of the stylus is determined by a processor decoding information from RF or light receivers. Yet another type of prior art system uses a surface-acoustic wave (SAW) device. With SAW, two transmitters set up a surface acoustic wave on the surface of the digitizer. The position of a person's finger or other stylus is detected by the finger or stylus reflecting/disturbing the acoustic wave.

Another type of prior art system uses an electromagnetic digitizer. The input of data by the user is realized as the result of a magnetic field emanating from the user's stylus interacting with the magnetic field or fields of the digitizer. Typically a grid of intersecting lines produces a field that can be either actively or passively modified by the field emanating from the stylus.

Each of these systems has had some success, yet each also has limitations that make them difficult if not undesirable for use. For example, direct contact technologies are subject to scratches and wear during normal operation. Wire-grid electromagnetic technology is quite expensive to implement and often requires additional heavy magnetic shielding behind the wire array to shield the system from undesirable magnetic influence. Light and RF systems require sophisticated electronics both for the source and for the receiver. Additionally, each and every one of these systems requires continuous power be supplied to the digitizer array in order to maintain the affect of stylus interaction.

In an effort to overcome one or more of these disadvantages applicants have recently proposed the use of an array of magnetic memory cells (each cell having a sense layer, intermediate layer and pinned reference layer) to provide an improved digitizer. While indeed an improvement in some ways, use of pinned reference magnetic memory cells presents certain disadvantages.

Generally, the principle underlying the storage of data in a magnetic media is the ability to change, and/or reverse, the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle the higher it's coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as magnetic tunnel junction memory (MTJ). A magnetic tunnel junction memory generally includes a sense layer (also called a storage layer, data layer or bit layer), a reference layer, and an intermediate layer between the sense layer and the reference layer. The sense layer, the reference layer, and the intermediate layer can be made from one or more layers of material.

The sense layer is usually a layer of magnetic material that stores a bit of data as an orientation of magnetization $M2$ that may be altered in response to the application of an external magnetic field or fields. More specifically, the orientation of magnetization $M2$ of the sense layer representing the logic state can be rotated (switched) from a first orientation representing a logic state of "0" to a second orientation, representing a logic state of "1", and/or vice versa.

The reference layer is a layer of magnetic material in which an orientation of magnetization $M1$ is "pinned", as in fixed, in a predetermined direction. Often several layers of magnetic material are required and function as one to effectuate a stable pinned reference layer. The direction is predetermined and established by microelectronic processing steps employed in the fabrication of the magnetic memory cell.

Typically, the logic state (a "0" or a "1") of a magnetic memory cell depends on the relative orientations of magnetization in the sense layer and the reference layer. For example, when an electrical potential bias is applied across the sense layer and the reference layer in a MTJ, electrons migrate between the sense layer and the reference layer through the intermediate layer. The intermediate layer is typically a thin dielectric layer commonly referred to as a tunnel barrier layer. The phenomena that cause the migration of electrons through the barrier layer may be referred to as quantum mechanical tunneling or spin tunneling.

The logic state may be determined by measuring the resistance of the memory cell. For example, if the overall orientation of the magnetization in the sense layer is parallel to the pinned orientation of magnetization in the reference layer the magnetic memory cell will be in a state of low resistance. If the overall orientation of the magnetization in the sense layer is anti-parallel (opposite) to the pinned orientation of magnetization in the reference layer the magnetic memory cell will be in a state of high resistance.

In an ideal setting the orientation of the alterable magnetic field in the sense layer would be either parallel or anti-parallel with respect to the field of the reference layer. As the sense layer and the reference layer are generally both made from ferromagnetic materials and are positioned in close permanent proximity to each other, the generally stronger reference layer may affect the orientation of the sense layer. More specifically, the magnetization of the reference layer may generate a demagnetization field that extends from the reference layer into the sense layer.

The result of this demagnetization field from the reference layer is an offset in the coercive switching field. This offset can result in asymmetry in the switching characteristics of the bit: the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

The magneto-resistance $\Delta R/R$ may be described as akin to a signal-to-noise ratio S/N. A higher S/N results in a stronger signal that can be sensed to determine the state of the bit in the sense layer. Thus, at least one disadvantage of a tunnel junction memory cell having a pinned reference layer in close and fixed proximity to the sense layer is a potential reduction in the magneto-resistance $\Delta R/R$ resulting from the angular displacement.

To pin the reference layer during manufacturing, the reference layer must be heated to an elevated temperature in an annealing step. The annealing step typically takes time, perhaps an hour or more. As the reference layer is but one part of the memory being produced, the entire memory must be subject to temperatures ranging from about 100 to 300 degrees centigrade while under the influence of a constant and focused magnetic field. Such manufacturing stresses may permit the reference layer to become un-pinned and lose it's set orientation if the memory is later subjected to high temperatures. In addition, the characteristics of the sense layer may be unknowingly affected by heat during some manufacturing processes.

To facilitate establishing a pinned reference layer it is not uncommon for the reference layer to include multiple layers of material. While utilizing multiple layers may help ensure that the reference layer remains pinned, it also raises the complexity of manufacturing each and every memory cell present in the magnetic memory.

When employed in a digitizer array, the magnetic memory cells are initialized such that each sense layer is oriented in a predetermined direction. As the users moves the stylus across the array, the magnetic field emanating from the stylus re-orients the sense layers most proximate to the stylus. The user directed re-orientation is registered by the system when the digitizer array is scanned. To register the user's next movement of the stylus, the digitizer array is re-initialized. As the scanning and re-initializing are performed every few microseconds the movements of the stylus by the user are recognized to the system.

Because of the ever present magnetic field of the pinned reference layer, the coercivity of the sense layer must at a minimum be greater than the offset in the coercive switching field described above. More specifically, the minimum coercivity of the sense layer is dictated at least in part by the offset force created by the pinned reference layer. In addition, as the magnetic field of the reference layer is constant, the coercivity of the sense layer must be great enough that the sense layer will maintain orientation at least until the system cycles through a read scan operation. Such longevity of orientation and heightened level of coercivity directly require higher levels of current to pass through the digitizer array. As such the size of the power supply and current conductors must be larger than might otherwise be desired as an issue of space and manufacturing cost.

As noted above, digitizers may exist as touch pads connected to a removed display or as touch screens that immediately display information beneath the stylus. The disadvantages noted above are present as well in such touch screen displays. Additionally, as a touch screen application requires both the elements of the display and the elements of the digitizer to be proximately located, the issues of size and space between components are even greater.

Hence, there is a need for an improved digitizing magnetic memory cell array that overcomes one or more of the drawbacks identified above. The present invention satisfies one or more of these needs.

SUMMARY

This invention provides soft-reference magnetic memory digitizing device for use in a touchpad/touch-screen device.

In particular, and by way of example only, according to an embodiment of the present invention, this invention provides a soft-reference magnetic memory digitizing device including: an array of soft-reference magnetic memory cells, each characterized by an alterable orientation of magnetization, the orientation changing upon the substantially proximate application of at least one externally-applied magnetic field as applied by a magnetically tipped stylus.

Moreover, according to an embodiment thereof, the invention may provide a method of using a soft-reference magnetic memory digitizing device having an array of magnetic memory cells, each memory cell characterized by at least one ferromagnetic sense layer characterized by an alterable orientation of magnetization, the orientation changing upon the substantially proximate application of at least one externally-applied magnetic field; and at least one ferromagnetic soft-reference layer having a non-pinned orientation of magnetization; wherein the alterable orientation of the sense layer is not substantially affected by the soft-reference layer, the method including: applying an external magnetic field to at least a portion of the array to change the magnetic orientation of at least one sense layer; reading the array by applying a sense current to the magnetic memory cells and reading the resistance of each cell, the sense current also sufficient to establish a magnetic field to orient the soft-reference layer during the read operation; and refreshing the array by applying a refresh current sufficient to align substantially all the sense layers to a predetermined orientation.

These and other objects, features and advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Figure 1:
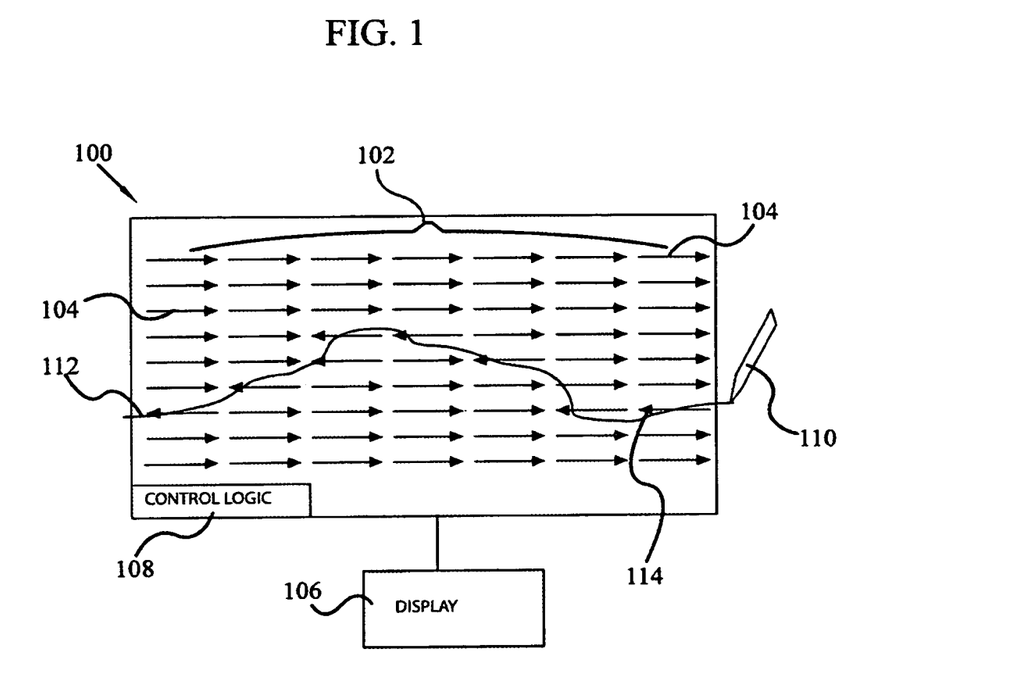
FIG. 1 is a schematic diagram of a soft-reference magnetic memory digitizing device according to the present invention.

Referring now to the drawings, and more particularly to FIG. 1, there is conceptually shown a portion of a soft-reference magnetic memory digitizing device 100 comprising an array 102 of soft-reference magnetic tunnel junction memory cells 104 (MTJ), functioning as a stylus-based input device. Operating as a touch-pad, the digitizer may be coupled to a processor which receives information from the digitizer 100 and directs appropriate output upon a display 106. Operating as a touch-screen, the digitizer is coupled directly to the display such that the state of the memory cells 104 directly drives the display 106 without need of an intervening processor. The digitizer 100 further includes control logic 108 that is used to control the digitizer 100 during operations such as read array and initialize array, which are well known to those skilled in the art and further discussed below.

The MTJ cells 104 are capable of storing at least two magnetic state possibilities. When initialized, for the sake of this discussion, the initial state of magnetic orientation stored within each MTJ cell 104 is oriented to the right. A stylus 110 with a magnetic tip providing a magnetic field external to the MTJ cells 104 is also shown. As the stylus 110 is moved across the surface of the digitizer 100 (shown as trace line 112), the magnetic field emanating from the tip of the stylus 110 is sufficient to reorient the field of the MTJ cells 114 which are substantially proximate to the tip of the stylus 110.

In at least one embodiment the tip of stylus 110 is characterized by a permanent magnet that provides a known field. In an alternative embodiment the tip of stylus 110 is characterized by a current carrying coil. It is further understood that the size of the MTJ cells 104 relative to the size of the tip of the stylus 110 may be such that placement and movement of the stylus 110 invariably affects more than one MTJ cell 104 at a time. In at least one embodiment the multiplicity of MTJ cells 104 proximate to the tip of the stylus 110 provides enhanced granularity in determining the position and movement of the stylus 110. The granularity or ratio of MTJ cells 104 to the stylus may be adjusted in accordance with the specific application desired for the digitizer 100.

Figure 2A:
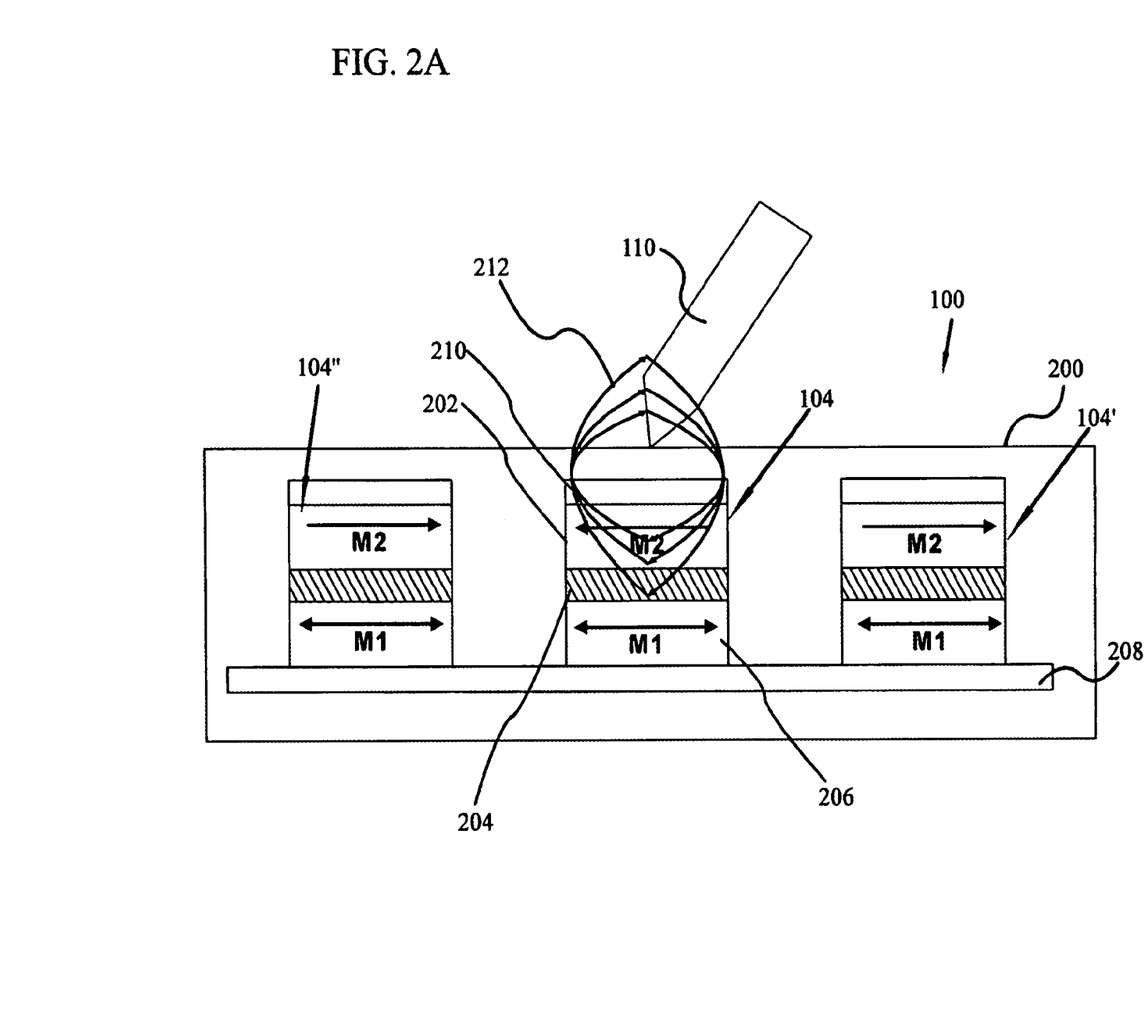
FIG. 2A is a plain cross sectional view of a portion of soft-reference magnetic memory digitizing device shown in FIG. 1.
Figure 2B:
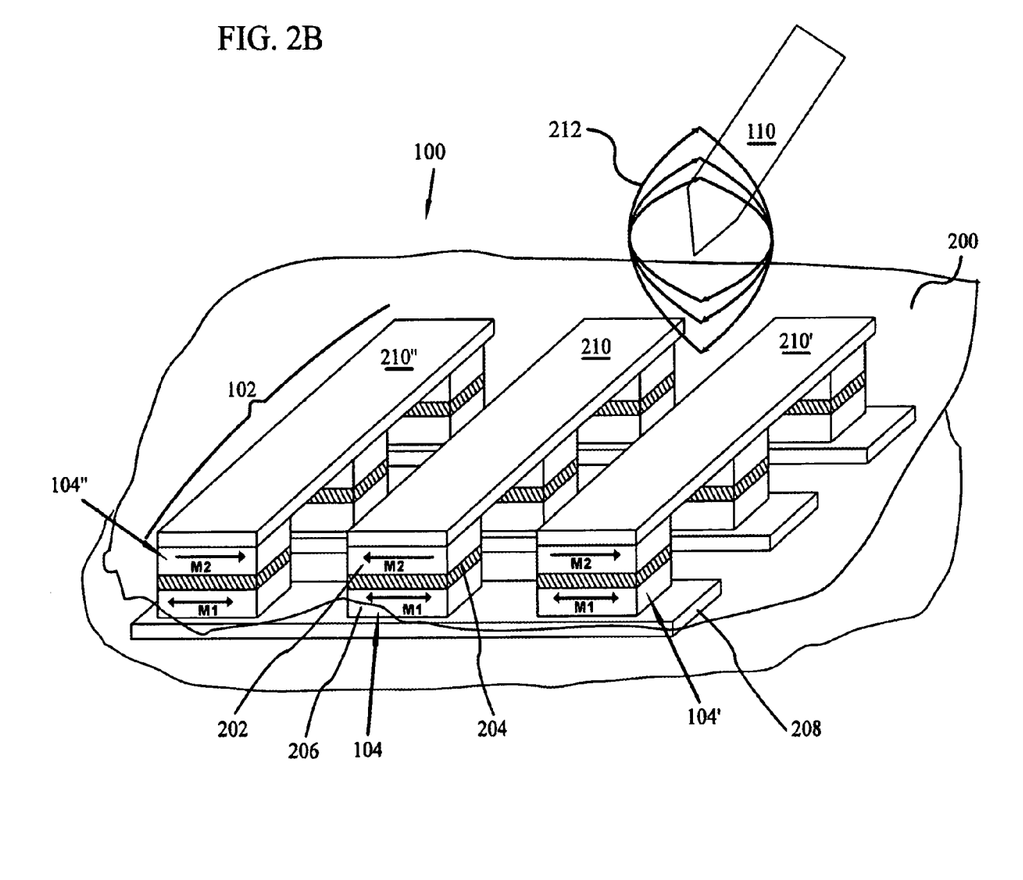
FIG. 2B is a perspective view of a portion of soft-reference magnetic memory digitizing device shown in FIG. 1.

The ability of a given MTJ cell 104 to respond to the substantially proximate application of the magnetic stylus 110 may be more fully appreciated with respect to FIGS. 2A and 2B, illustrating a cross sectional side view portion of digitizer 100 (FIG. 2A) and a prospective view of a portion of the digitizer 100 (FIG. 2B). As the interaction between the stylus 110 and the MTJ cells 104 is due to magnetic fields, physical contact is not required. Accordingly the array 102 of MTJ cells 104 may be protectively located below the outer surface 200 of the digitizer 100. Moreover, in touch-screen applications, the digitizer 100 may be located behind the display (such as for example a liquid crystal display).

As shown, MTJ cell 104 has at least one ferromagnetic sense layer 202, an intermediate layer 204, and at least one soft-reference layer 206. The ferromagnetic sense layer 202 is characterized by an alterable orientation of magnetization M2. As stated above, in the initial state M2 is oriented to the right, as is the condition of MTJ cells 104' and 104". The orientation of magnetization M2 is changed upon the substantially proximate application of at least one externally-applied magnetic field 212. More specifically, as shown the stylus 110 provides a magnetic field 212 that for the portion imposed upon MTJ cell 104 is oriented to the left. As implied by FIGS. 2A and 2B showing first the proximate application of magnetic field 212 to MTJ cell 104 to chanae M2 to left orientation (FIG. 2A), and the subsequent removal of magnetic field 212 from MTJ cell 104 which remains with M2 having a left orientation, it is understood and appreciated that the magnetic field 212 provided by stylus 110 is sufficient to overcome the coercivity of sense layer 202, and thus change the orientation of M2 from right to left. More simply stated, the sense layer "senses" the presence of an external magnetic field 212 and can reorient itself accordingly. The intermediate layer 204 has opposing sides such that the sense layer 202 in contact with one side is in vertical alignment with, and substantially uniformly spaced from, the soft-reference layer, in contact with the second side of the intermediate layer 204.

The soft-reference layer 206 is so named because the direction of orientation of magnetization M1 can be dynamically set to a known direction. Unlike a tynical reference layer which are hard-pinned in a selected orientation, the soft-reference layer 206 is unpinned. In the presence of magnetic fields the soft-reference layer 206 will achieve an orientation, however such orientation is dynamic. Magnetic field 212 may cause a temporary alignment of soft-reference layer 206 as the magnetic field 212 orients M1 of the sense layer, however the temporary orientation of M1 is of substantially no consequence as the orientation of M1 is not permanent. The orientation of the soft-reference layer 206, i.e., M1, is truly only at issue when it is dynamically set during a read operation, further discussed below. Such dynamic setting during a read operation may be achieved by magnetic fields provided by an externally supplied current flowing through the row 208 and column 210 intersecting at MTJ cell 104. More specifically, the current flowing through row 208 produces a first magnetic field, and the current flowing through column 210 produces a second magnetic field. The two fields are orthogonal and substantially combine at their cross point intersection and are sufficient to orient the soft-reference layer 206.

As the MTJ cells 104 are located at cross point intersections such a system permits the individual selection of a given MTJ cell 104. In this case, the current magnitude applied to the row 208 and the column 210 to set the magnetization M1 of the soft reference layer 206 to a known direction is relatively small. This current will not alter the magnetization state M2 of the sense layer 202 or other unselected memory cells, which at most are subjected to half the combined field. In the absence of this current applied to the row 208 and column 210 the orientation of M1 is affectively released. As the current flowing through row 208 and column 210 in a read cycle provided combining fields sufficient to align M1 (the soft-reference layer 206) without altering M2 (the sense layer 202), they are understood and appreciated to be low read fields.

Generally, aligning the soft-reference layer 206 is an event that occurs during a read cycle when the magnetization M1 of the soft-reference layer 206 is set to a known direction and then compared with the direction of M2 of the sense layer 202 to determine the "0" or "1" state of the memory bit cell. It is termed "soft" because it generally comprises materials that are magnetically soft and are not of the usual hard-pinned materials used for more traditional pinned reference layers. When utilizing a soft reference layer, a convention is generally adopted as to which way M1 will be oriented.

The comparison of M1 and M2 is achieved by measuring resistance in the MTJ cell 104. As current is flowing through row 208 and column 210 to dynamically align soft-reference layer 206, current is also being provided to flow through MTJ cell 104. If the orientation of M2 of the sense layer 202 is parallel to the dynamic orientation of M1 of the soft-reference layer 206 the MTJ cell 104 will be in a state of low resistance. If the orientation of M2 of the sense layer 202 is anti-parallel to the dynamic orientation of M1 of the soft-reference layer 206 the MTJ cell 104 will be in a state of high resistance. A convention is generally adopted to indicate that high resistance is a logical "1" and low resistance is a logical "0", or vis-a-versa. The phenomenon that causes the resistance in the MTJ cell 104 is well understood in the magnetic memory art and is well understood for TMR memory cells. GMR and CMR memory cells have similar magnetic behavior but their magneto-resistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 204 is a thin barrier of dielectric material through which electrons quantum mechanically tunnel between the sense layer 202 and the soft-reference layer 206.

In a GMR memory cell, the intermediate layer 204 is a thin spacer layer of non-magnetic but conducting material. Here the conduction is a spin-dependent scattering of electrons passing between the sense layer 202 and the soft-reference layer 206 though the intermediate layer 204. In either case, the resistance between the sense layer 202 and the soft-reference layer 206 will increase or decrease depending on the relative orientations of the magnetic fields M1 and M2. It is that difference in resistance that is sensed to determine if the sense layer 202 is storing a logic state of "0" or a logic state of "1".

In at least one embodiment, the ferromagnetic sense layer 202 has a coercitivity higher than the soft-reference layer 206, and may be made from a material that includes, but it not limited to: Nickel Iron (NiFe), Nickel Iron Cobalt (NiFeCo), Cobalt Iron (CoFe), and alloys of such metals. In addition, both the soft-reference layer 206 and the sense layer 202 may be formed from multiple layers of materials. However, for conceptual simplicity and ease of discussion, each layer component is herein discussed as a single layer.

In at least one embodiment, the intermediate layer 204 is a tunnel layer made from an electrically insulating material (a dielectric) that separates and electrically isolates the sense layer 202 from the soft-reference layer 206. Suitable dielectric materials for the dielectric intermediate layer 204 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 204 is a tunnel layer made from a non-magnetic material such as a 3d, a 4d, or a 5d transition metal listed in the periodic table of the elements. Suitable non-magnetic materials for a non-magnetic intermediate layer 204 may include, but are not limited to: Copper (Cu), Gold (Au) and Silver (Ag). While the actual thickness of the intermediate layer 204 is dependent upon the materials selected to create the intermediate layer 204 and the type of tunnel memory cell desired, in general, the intermediate layer 204 may have a thickness of about 0.5 nm to about 5.0 nm.

The use of a soft reference layer has several advantageous benefits in the MTJ cell 104. As a soft-reference layer is not substantially fixed in orientation, it may not be necessary to subject the MTJ cell 104 to high temperatures during manufacturing as is often required to establish a fixed reference layer. Further, achieving a pinned reference layer often entails complex fabrication procedures involving multiple layers of specialized materials. In addition, the lack of a substantial and constant magnetic field in the soft-reference layer 206 reduces the likelihood of a demagnetization field from the soft-reference layer 206 acting upon the sense layer 202, thus reducing if not eliminating the offset in the coercive switching field.

The substantial elimination of the offset field is quite advantageous. As a direct result, when selecting the coercivity for the sense layer 202, the issue of the offset field need not be considered. Further, so long as the coercivity of the sense layer 202 is greater than the coercivity of the soft-reference layer 206, and understanding that the soft-reference layer 206 need only have purposeful orientation during a read operation, the presence of a magnetic field within the soft-reference layer 206 itself may be largely discounted when selecting the desired coercivity of the sense layer 202.

In other words, the coercivity of sense layers 202 may be significantly lower than the coercivity in sense layers of prior art digitizing devices. Reducing the coercivity in the sense layer 202 advantageously reduces the current need required for initializing the MTJ cell 104 and might therefore permit a smaller power source, and/or transistor to be used. In addition, as the sense layer 202 coercitivity decreases, the intensity of the magnetic field 212 emanating from the stylus 110 may also be decreased. Reducing the required magnetic field 212 of the stylus 110 advantageously reduces magnetic shielding that may be required where the digitizer is proximate to other sensitive electronics.

It shall be recognized that the MTJ cells 104 comprising the array 102 may operate independently of one another and the stylus. As such more than one stylus 110 may be utilized, each of which operates independently of the other, such as, for example in the case of a multi-fingered stylus glove.

As stated above, control logic 108 within the display directs operations such as read array (a reading state) and initialize array (a refreshing state). These tasks are performed with supporting drive electronics within the digitizer that are well known to those skilled in the art. Movement of the stylus 110 proximate to a MTJ cell 104 causes the sense layer 202 to switch orientation from it's initialized position, i.e., from M2 oriented to the right to M2 oriented to the left as described above. To register this switch, in at least one embodiment the control logic 108 operates in cycles. In a first cycle, a low read current is systematically directed to each MTJ cell 104 in the array 102 by systematic row 208 and column 210 selection, and the detected resistance noted. In a second cycle, a higher initialize current is directed to each cell by rows 208 and columns 210, thus providing higher fields which when combined are sufficient to overcome the coercivity of each sense layer 202 so as to re-set the orientation M2 of any and all sense layers 202 that may have been reoriented. As the reading state involves low read currents providing low read fields, the orientation of each sense layer 202 is unaffected during the reading cycle or state. As the initialize operation is applied to all MTJ cells 104 in the array 102, it may be applied substantially simultaneously to all MTJ cells 104 without specific row 208 and column 210 addressing. As described above, the orientation of each soft-reference layer 206 is dynamic. The temporary alignment of M1 that may occur during the refreshing of the sense layers 202 is of no more consequence then the temporary alignment of M1 that may occur in the presence of the magnetic field provided by the external stylus. Again, the orientation of each soft-reference layer 206 is dynamically set during each read cycle by providing low read fields as described above. To insure a high probability of detecting the presence and position of the stylus, the cycle time is about 0.1 to 5 milliseconds. Moreover, the cycle time is set to be faster than a user is likely to move the stylus 110.

In at least one embodiment the read cycle may be an active condition. Specifically the digitizer 100 cycles between the read state and the initialize state such that at substantially all times a current is flowing through the array 102 of MTJ cells 104. In an alternative embodiment, the read cycle may be passive. Specifically the digitizer 100 cycles through an "off" state as well, i.e. read, refresh, off, and then read, refresh again. The inclusion of a rest state may be desired for the conservation of power.

As the condition of the sense layer 202 need only be maintained through a read cycle, in at least one embodiment the coercivity of the sense layer 202 may be so low that unlike a traditional prior art MTJ cell 104 the sense layer 202 does not hold it's condition substantially indefinitely. In light of the reduced manufacturing costs and complexities, significant reduction in power requirements (physical size and current strength), reduced stylus 110 and initialization magnetic fields, and intention to re-initialize the MTJ cells 104 at regular intervals, the traditional longevity is in many applications an un-necessary and superfluous condition.

Figure 3:
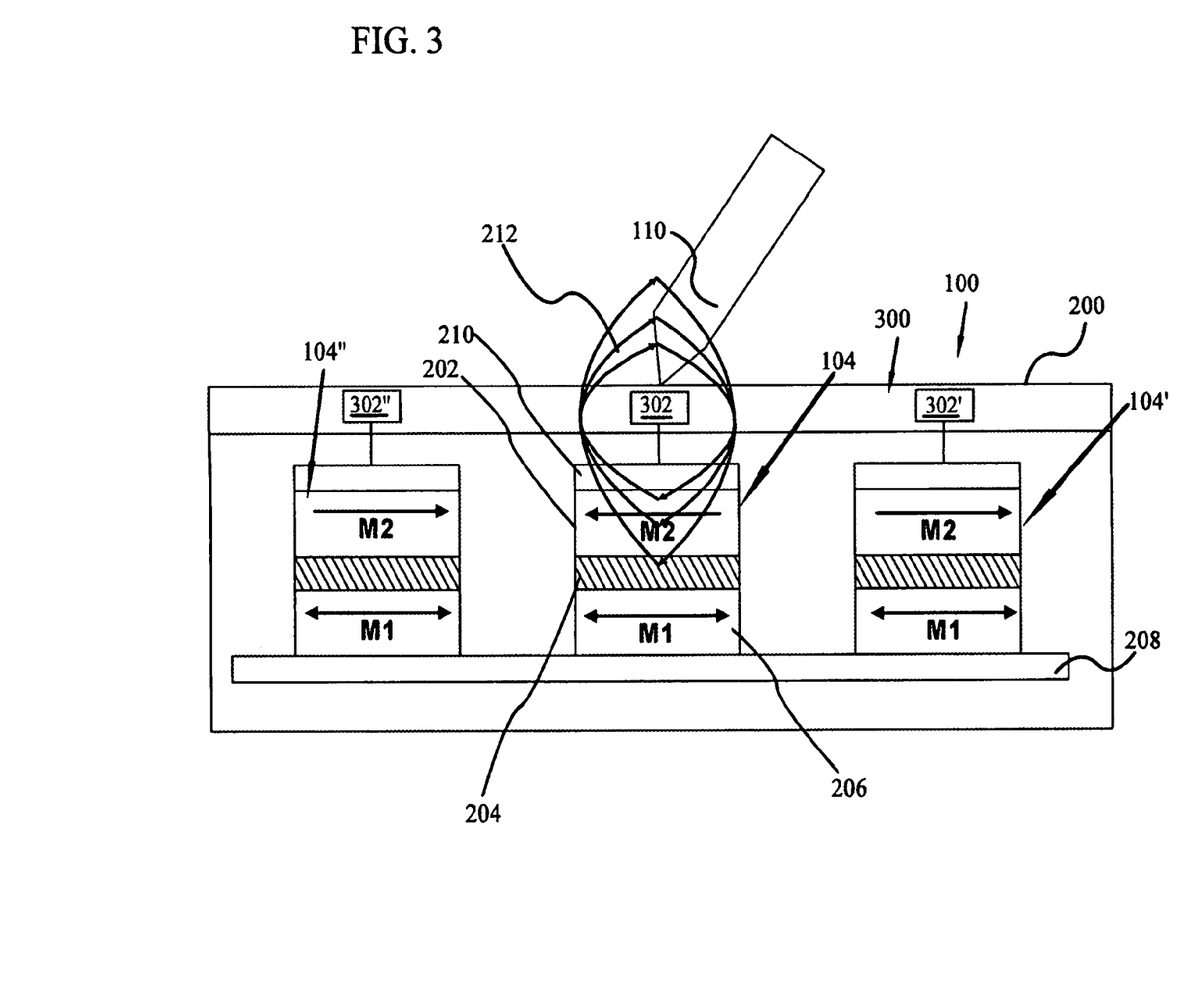
FIG. 3 is a plain cross sectional view of a portion of the soft-reference magnetic memory digitizing device of FIG. 1 further including an integrated display.
Figure 6:
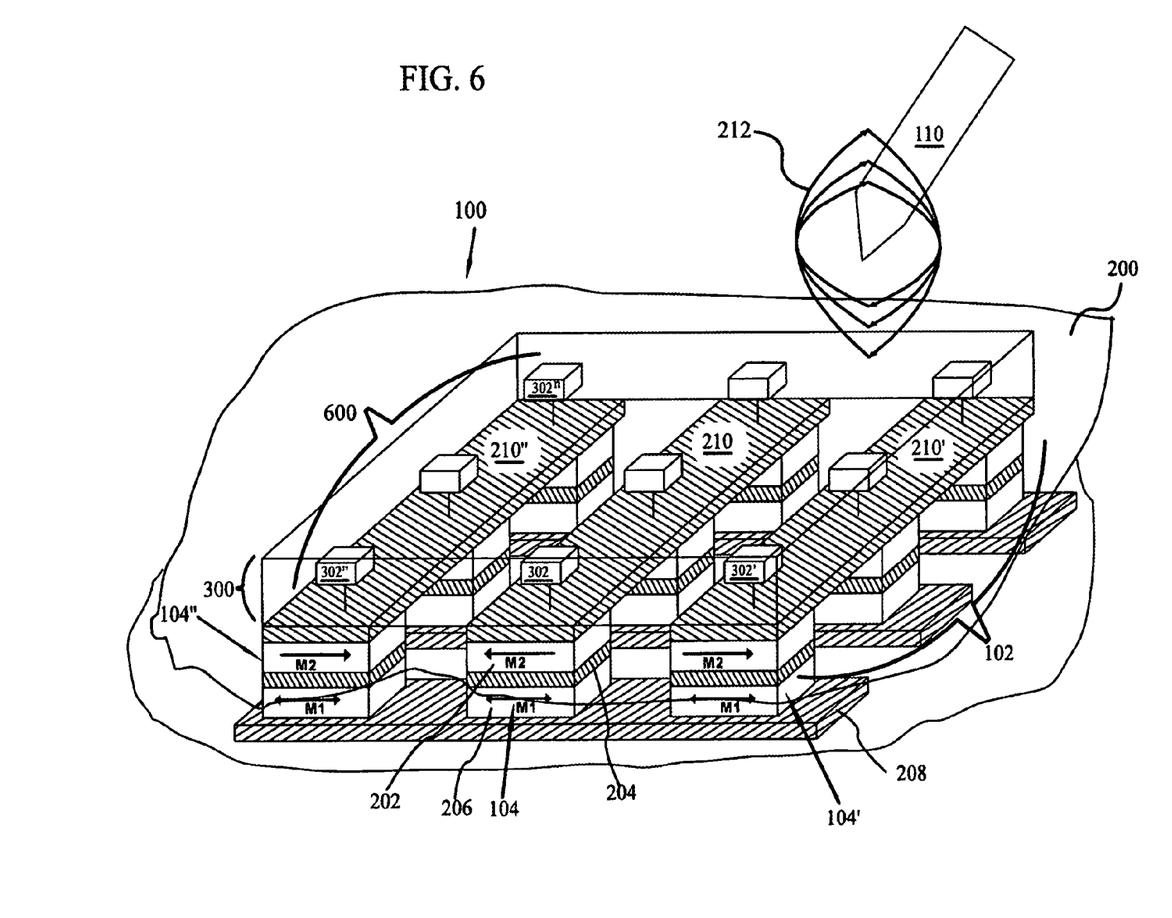
FIG. 6 is a perspective view of a portion of the soft-reference magnetic memory digitizing device shown in FIG. 3.

As shown in FIG. 3, in at least one embodiment, a display 300 is at least partly integrated with the array 102 of MTJ cells 104. The display 300 is characterized by an array of pixels 302. In such a setting, each MTJ cell 202 is further coupled to at least one pixel 302, such that the MTJ cells 104 of the digitizer 100 actively controls the pixels 302 of the display 300, thus providing a touch-screen. FIG. 6 provides a partial perspective view of magnetic memory digitizing device 100 incorporating a display 300 above the array 102 of MTJ cells 104. Display 300 includes an array of pixels 600, of which pixel 302, 302', 302" . . . 302‴ are exemplary. As shown, both the display 300 and the array 102 of MTJ cells 104 are below the encasing outer surface 200. In at least one embodiment the encasing outer surface of the display may be encasing outer surface 200. It is understood and appreciated that display panels such as display 300 provide visual information in the form of text, shapes, images or the like. Fundamentally, such information is composed of pixels, the smallest complete component of the image. As one or more MTJ cells 104 of the array 102 activate their associated pixels 302, visual information is created and perceived by the user. As pixel 302 is above MTJ cell 104, when activated by the sense layer of MTJ cell 104 being reoriented, the illumination of pixel 302, and thus it's component of visual information, is displayed upon the display 300 proximate to the sense layer 202 of MTJ cell 104. Display panels used in such touch screen applications typically employs transistors in an active matrix, and are well known to those skilled in the art. Here, the MTJ cells 104 of the array 102 are mated to the array of transistors in at least a one-to-one relationship as is further shown in FIG. 4. The condition of the sense layer 201 in each MTJ cell 202 is thereby used to control the pixels 302 of the display 300.

Figure 4:
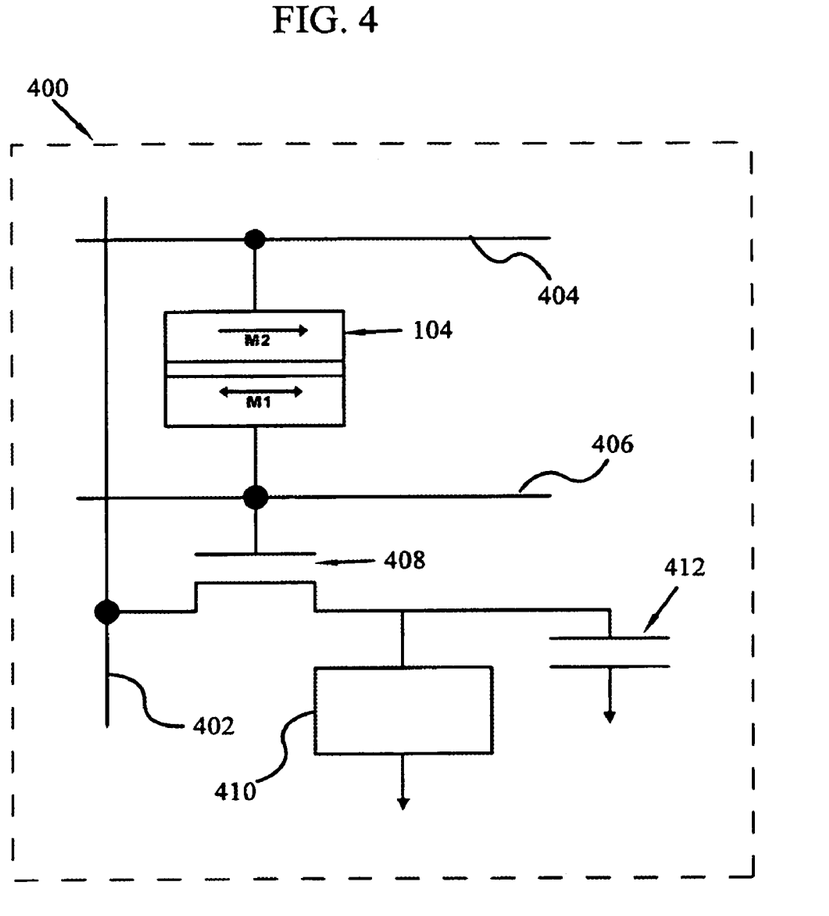
FIG. 4 is a schematic diagram of a soft-reference magnetic memory cell shown in FIG. 3 controlling a display pixel.

FIG. 4 illustrates a schematic diagram of a portion of an array of pixels as controlled by a MTJ cell 104 as integrated in a single touch-screen display system. Shown are a pixel 400 (represented as the contents within the dotted line), a pixel enable line 402, a row voltage line 404 and a column voltage line 406. A MTJ cell 104 is fixed between the row 404 and column 406 voltage lines. Voltage line 406 is then further coupled to a field effect transistor 408, or other appropriate switching device. The power source for the transistor 408 is coupled to the pixel enable line 402. Transistor 408 thereby controls pixel diode 410 in accordance with the state of the MTJ cell 104. Each pixel diode 410 is coupled to a capacitor 412 to provide a constant source of power to the pixel diode 410 when it is active.

The single schematic shown may be reproduced for red, green and blue pixels thereby permitting the display to provide color as a RGB matrix. Further, it shall be noted that to balance color intensity more pixels of one color may be provided over another color. Alternatively, the color intensity may be controlled by another memory cell.

Figure 5:
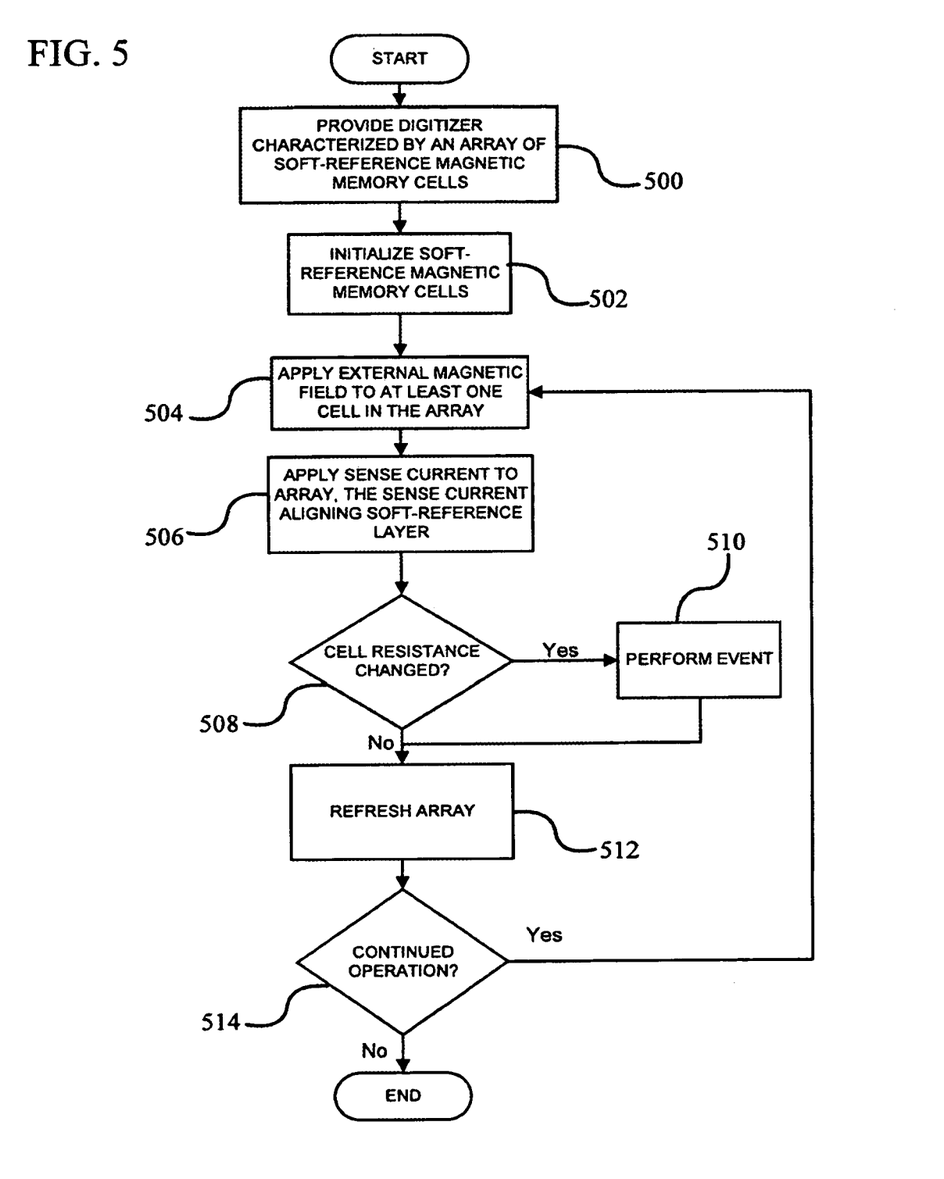
FIG. 5 is a flow diagram of the operation of the soft-reference magnetic memory digitizing device shown in the above figures.

Having described the physical structure of the soft-reference magnetic digitizer 100, a method of operating same is now described with reference to the flow diagram provided in FIG. 5. It will be appreciated that the described method need not be performed in the order in which it is herein described, but that this description is merely exemplary of one method of using a soft-reference magnetic digitizer 100.

Initially, as shown in block 500, a soft-reference magnetic digitizer 100 as described above is formed and provided to the user. Depending on how the digitizer is provided, it may be appropriate to initialize the sense layer 202 of each MTJ cell 104 in the array 102 to align substantially all the sense layers to a predetermined orientation, as shown in block 502.

The user applies an external magnetic field 212 via the use of a stylus as indicated in block 504, and as represented in the trace line 112 of FIG. 1. The sense layers 202 of MTJ cells 104 proximate to the magnetic field 212 of the stylus 110 will re-orient themselves in accordance with the affect of the stylus 110 magnetic field 212.

At cyclical intervals the control logic 108 of the digitizer 100 will systematically apply a sense current to the MTJ cells 104 of the array 102, as shown in block 506. The sense current is sufficient to align the soft-reference layer 206 in a predetermined orientation. The resistance of the MTJ cell is then measured and evaluated to determine if the sense layer 202 has been changed from it's original predetermined orientation.

As shown in decision block 508, if the evaluation of the resistance indicates no change, the control logic 108 will continue on through the remaining MTJ cells 104 of the array 102. If the evaluation of the resistance indicates that the sense layer 202 has indeed changed, the control logic will direct the performance of some event as indicated in block 510. In at least one embodiment this event will be the display of an image upon a display that corresponds to the trace of the magnetic stylus 110 upon the digitizer 100.

Additional and alternative events may also be performed such as a signal from the digitizer to a computer system to perform a desired event such as the launch of an application.

In certain instances the digitizer may be provided as a touch-screen device. In accordance with the above description of pixel control being tied to the state of the MTJ cells 104, the pixels 400 of the display will provide a visual image corresponding to the location proximate to where the user has applied the magnetic field 212.

Following the commencement of the event in block 510 the control logic 108 will continue on through the remaining MTJ cells 104 of the array 102. Following the read scan of the array 102, the control logic 108 will refresh the array 102 as shown in block 512 by applying a refresh current sufficient to align substantially all the sense layers within the array 102 to a predetermined orientation. In at least one embodiment the refresh array operation is performed in a systematic process of accessing one MTJ cell 104 at a time. In an alternative embodiment the refresh array operation is performed by accessing a plurality of MTJ cells 104 substantially simultaneously.

As shown in decision block 514, if it is desired to continue operation of the soft-reference magnetic digitizer 100, the method returns to block 504 where the user again provides an external magnetic field 212 with the stylus 110.

It is further understood and appreciated that the control logic 108 may be enhanced to recognize a user's desire to invoke an event, such as by prolonged stationary placement of the stylus 110. In an alternative embodiment, such as where the stylus 110 utilizes a field coil to provide the magnetic field 212, a depressing of the stylus 110 against the surface 200 of the digitizer 100 may briefly intensify the magnetic field 212, and thus affect a greater radius of MTJ cells 104.

As noted above, the digitizer 100 may accommodate more than a single stylus 110. In such situations the control logic can and will properly associate the MTJ cells 104 affected by the multiple stylus 110.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A soft-reference magnetic memory digitizing device comprising:
    an array of soft-reference magnetic memory cells, each having at least one ferromagnetic sense layer characterized by an alterable orientation of magnetization, the orientation changing upon a substantially proximate application of at least one externally-applied magnetic field as applied by a magnetically tipped stylus.

2. A soft-reference magnetic memory digitizing device comprising:
    an array of soft-reference magnetic memory cells, having at least one ferromagnetic sense layer each characterized by an alterable orientation of magnetization, the orientation changing upon a substantially proximate application of at least one externally-applied magnetic field; and
    at least one magnetically tipped stylus for applying at least one external magnetic field to at least one magnetic memory cell of the array.

3. The soft-reference digitizer of claim 2, further comprising a display operable to display information, the display coupled to the array of magnetic memory cells such that the orientation of a given memory cell is used locally within the display to determine the information displayed upon the display proximate to the given memory cell.

4. A soft-reference magnetic memory digitizing device comprising:
    an array of soft-reference magnetic memory cells, each memory cell including:
        at least one ferromagnetic sense layer characterized by an alterable orientation of magnetization, the orientation changing upon a substantially proximate application of at least one externally-applied magnetic field;
        at least one ferromagnetic soft-reference layer having a non-pinned orientation of magnetization; and
        at least one intermediate layer forming a magnetic tunnel junction between the sense layer and the soft-reference layer,
        wherein the alterable orientation of the sense layer is not substantially affected by the soft-reference layer; and
    at least one magnetically tipped stylus for applying at least one external magnetic field to at least one magnetic memory cell of the array.

5. The soft-reference digitizer of claim 4, wherein the sense layer has a higher coercivity than the soft-reference layer.

6. The soft-reference digitizer of claim 4, wherein the magnetic tip of the stylus is a permanent magnet.

7. The soft-reference digitizer of claim 4, wherein the magnetic tip of the stylus is a current-carrying coil.

8. The soft-reference digitizer of claim 4, further comprising a display operable to display information, the display coupled to the array of magnetic memory cells such that the orientation of a given sense layer is used locally within the display to determine the information displayed upon the display proximate to the given sense layer.

9. The soft-reference digitizer of claim 4, further comprising a display characterized by an array of pixels, the display at least partially integrated with the array of magnetic memory cells, each memory cell further being coupled to at least one pixel.

10. A soft-reference magnetic memory digitizing device comprising:
    a plurality of magnetic memory cells, each memory cell including:
        at least one ferromagnetic sense layer characterized by an alterable orientation of magnetization, the orientation changing upon a substantially proximate application of at least one externally-applied magnetic field;
        an intermediate layer in contact with the sense layer; and
        at least one ferromagnetic soft-reference layer having a non-pinned orientation of magnetization; the reference layer in contact with the intermediate layer, opposite from the sense layer,
wherein the alterable orientation of the sense layer is not substantially affected by the soft-reference layer; and
at least one magnetically tipped stylus for applying at least one external magnetic field to at least one magnetic memory cell of the array.

11. The soft-reference digitizer of claim 10, wherein the sense layer has a higher coercivity than the soft-reference layer.

12. The soft-reference digitizer of claim 10, wherein the magnetic tip of the stylus is a permanent magnet.

13. The soft-reference digitizer of claim 10, wherein the magnetic tip of the stylus is a current-carrying coil.

14. The soft-reference digitizer of claim 10, further comprising a display operable to display information, the display coupled to the array of magnetic memory cells such that the orientation of a given sense layer is used locally within the display to determine the information displayed upon the display proximate to the given sense layer.

15. The soft-reference digitizer of claim 10, further comprising a display characterized by an array of pixels, the display at least partially integrated with the array of magnetic memory cells, each memory cell further being coupled to at least one pixel.

16. A method of using a soft-reference magnetic memory digitizing device comprising:
providing an array of soft-reference magnetic memory cells, each characterized by a sense layer having an alterable orientation of magnetization and a soft-reference layer, the orientation of the sense layer changing upon a substantially proximate application of at least one externally-applied magnetic field; and
applying an external magnetic field to at least a portion of the array to change the magnetic orientation of at least one memory cell;
reading the array by applying a sense current to the magnetic memory cells and reading a resistance of each cell, the sense current also sufficient to establish a magnetic field to orient the soft-reference layer during the read operation; and
refreshing the array by applying a refresh current sufficient to align substantially all the memory cells to a predetermined orientation.

17. The method of claim 16, further including initializing the array by applying an initialize current sufficient to align substantially all the sense layers to a predetermined orientation.

18. The method of claim 16, further comprising displaying an image upon a display, the image corresponding to the applied external magnetic field as determined by the resistance of each cell within the array.

19. The method of claim 18, wherein the display is comprised of an array of pixels, the display at least partially integrated with the array of magnetic memory cells, each memory cell further being coupled to at least one pixel.

20. The method of claim 16, wherein the digitizing device continuously cycles between a reading and a refreshing state.

21. A method of using a soft-reference magnetic memory digitizing device having an array of magnetic memory cells, each memory cell characterized by at least one ferromagnetic sense layer characterized by an alterable orientation of magnetization, the orientation changing upon a substantially proximate application of at least one externally-applied magnetic field; and at least one ferromagnetic soft-reference layer having a non-pinned orientation of magnetization; wherein the alterable orientation of the sense layer is not substantially affected by the soft-reference layer, the method comprising:
applying an external magnetic field to at least a portion of the array to change the magnetic orientation of at least one sense layer;
reading the array by applying a sense current to the magnetic memory cells and reading a resistance of each cell, the sense current also sufficient to establish a magnetic field to orient the soft-reference layer during the read operation; and
refreshing the array by applying a refresh current sufficient to generate a re-fresh magnetic field sufficient to align substantially all the sense layers to a predetermined orientation.

22. The method of claim 21, further including initializing the array by applying an initialize current sufficient to align substantially all the sense layers to a predetermined orientation.

23. The method of claim 21, further comprising displaying an image upon a display, the image corresponding to the applied external magnetic field as determined by the resistance of each cell within the array.

24. The method of claim 23, wherein the display is comprised of an array of pixels, the display at least partially integrated with the array of magnetic memory cells, each memory cell further being coupled to at least one pixel.

25. The method of claim 21, wherein the digitizing device continuously cycles between a reading and a refreshing state.

26. A method of using a soft-reference magnetic memory digitizing device comprising:
providing an array of magnetic memory cells, each memory cell including:
at least one ferromagnetic sense layer characterized by an alterable orientation of magnetization, the orientation changing upon a substantially proximate application of at least one externally-applied magnetic field;
an intermediate layer in contact with the sense layer; and
at least one ferromagnetic soft-reference layer having a non-pinned orientation of magnetization; the reference layer in contact with the intermediate layer, opposite from the sense layer;
wherein the alterable orientation of the sense layer is not substantially affected by the soft-reference layer;
applying an external magnetic field to at least a portion of the array to change the magnetic orientation of at least one sense layer;
reading the array by applying a sense current to the magnetic memory cells and reading a resistance of each cell, the sense current also sufficient to establish a magnetic field to orient the soft-reference layer during the read operation; and
refreshing the array by applying a refresh current sufficient to generate a re-fresh magnetic field sufficient to align substantially all the sense layers to a predetermined orientation.

27. The method of claim 25, further including initializing the array by applying an initialize current sufficient to align substantially all the sense layers to a predetermined orientation.

28. The method of claim 25, further comprising displaying an image upon a display, the image corresponding to the applied external magnetic field as determined by the resistance of each cell within the array.

29. The method of claim 28, wherein the display is comprised of an array of pixels, the display at least partially integrated with the array of magnetic memory cells, each memory cell further being coupled to at least one pixel.

30. The method of claim 25, wherein the digitizing device continuously cycles between a reading and a refreshing state.

31. A soft-reference magnetic memory digitizing device comprising:
   an encasing outer surface;
   an array of soft-reference magnetic memory cells encased within and disposed below the outer surface, each characterized by an alterable orientation of magnetization, the orientation changing upon a substantially proximate application of at least one externally-applied magnetic field; and
   a magnetically tipped stylus external to the encasing outer surface, the stylus operable to apply at least one external magnetic field to at least one magnetic memory cell of the array.

32. The soft-reference magnetic memory digitizing device of claim 31, wherein each soft-reference magnetic memory cell of the array comprises:
   at least one ferromagnetic sense layer characterized by an alterable orientation of magnetization, the orientation changing upon a substantially proximate application of the least one externally-applied magnetic field;
   at least one ferromagnetic soft-reference layer having a non-pinned orientation of magnetization, wherein the alterable orientation of the sense layer is not substantially affected by the soft-reference layer; and
   at least one intermediate layer forming a magnetic tunnel junction between the sense layer and the soft-reference layer.

33. The soft-reference digitizer of claim 32, wherein the sense layer has a higher coercivity than the soft-reference layer.

34. The soft-reference digitizer of claim 32, further comprising a display operable to display information, the display coupled to the array of magnetic memory cells such that the orientation of a given sense layer is used locally within the display to determine the information displayed upon the display proximate to the given sense layer.

* * * * *